United States Patent [19]

Tournier

[11] Patent Number: 5,221,910
[45] Date of Patent: Jun. 22, 1993

[54] SINGLE-PIN AMPLIFIER IN INTEGRATED CIRCUIT FORM

[75] Inventor: Christian Tournier, Seyssinet, France

[73] Assignee: SGS-Thomson Microelectronics S.A., Gentilly, France

[21] Appl. No.: 908,487

[22] Filed: Jun. 30, 1992

Related U.S. Application Data

[63] Continuation of Ser. No. 774,063, Oct. 9, 1991, abandoned.

[30] Foreign Application Priority Data

Oct. 9, 1990 [FR] France ............... 90 12438

[51] Int. Cl.$^5$ ............................................. H03F 3/26
[52] U.S. Cl. ............................... 330/264; 330/269; 330/307
[58] Field of Search ............ 330/264, 149, 307, 269; 307/443, 263

[56] References Cited

U.S. PATENT DOCUMENTS

| | | | |
|---|---|---|---|
| 3,886,464 | 5/1975 | Dingwall | 330/269 |
| 4,038,607 | 7/1977 | Schade, Jr. | 330/264 |
| 4,045,747 | 8/1977 | Hsu | 330/277 |
| 4,103,188 | 7/1978 | Morton | 330/264 |
| 4,806,804 | 2/1989 | O'Leary | 307/605 |
| 4,890,016 | 12/1989 | Tanaka et al. | 330/264 |
| 5,061,864 | 10/1991 | Rogers | 307/443 |
| 5,087,841 | 2/1992 | Rogers | 307/443 |
| 5,148,120 | 9/1992 | Kano et al. | 330/264 |

FOREIGN PATENT DOCUMENTS

| | | | |
|---|---|---|---|
| 0236525 | 9/1987 | European Pat. Off. | |
| 2737506 | 8/1977 | Fed. Rep. of Germany | 330/264 |
| 55-11615A | 1/1980 | Japan | 330/264 |
| 57-188115 | 11/1982 | Japan | 330/264 |
| WO80/01124 | 5/1980 | PCT Int'l Appl. | 330/264 |

Primary Examiner—Robert J. Pascal
Assistant Examiner—Tan Dinh
Attorney, Agent, or Firm—Groover & Bruning

[57] ABSTRACT

A CMOS integrated circuit incorporating both logic functions and analog functions. The latter are subjected to noise from the logic transitions by means of supply conductors. To avoid disturbing the rest point of an amplifier by this supply noise, without using compensation circuits which would increase the number of pins of the integrated circuit, it is proposed to supply a pair of complementary transistors forming an amplifier stage by identical incoming and outgoing current generators. These generators are transistors copying a current from a current mirror circuit which includes a pair of complementary transistors connected between the two power supply lines.

39 Claims, 1 Drawing Sheet

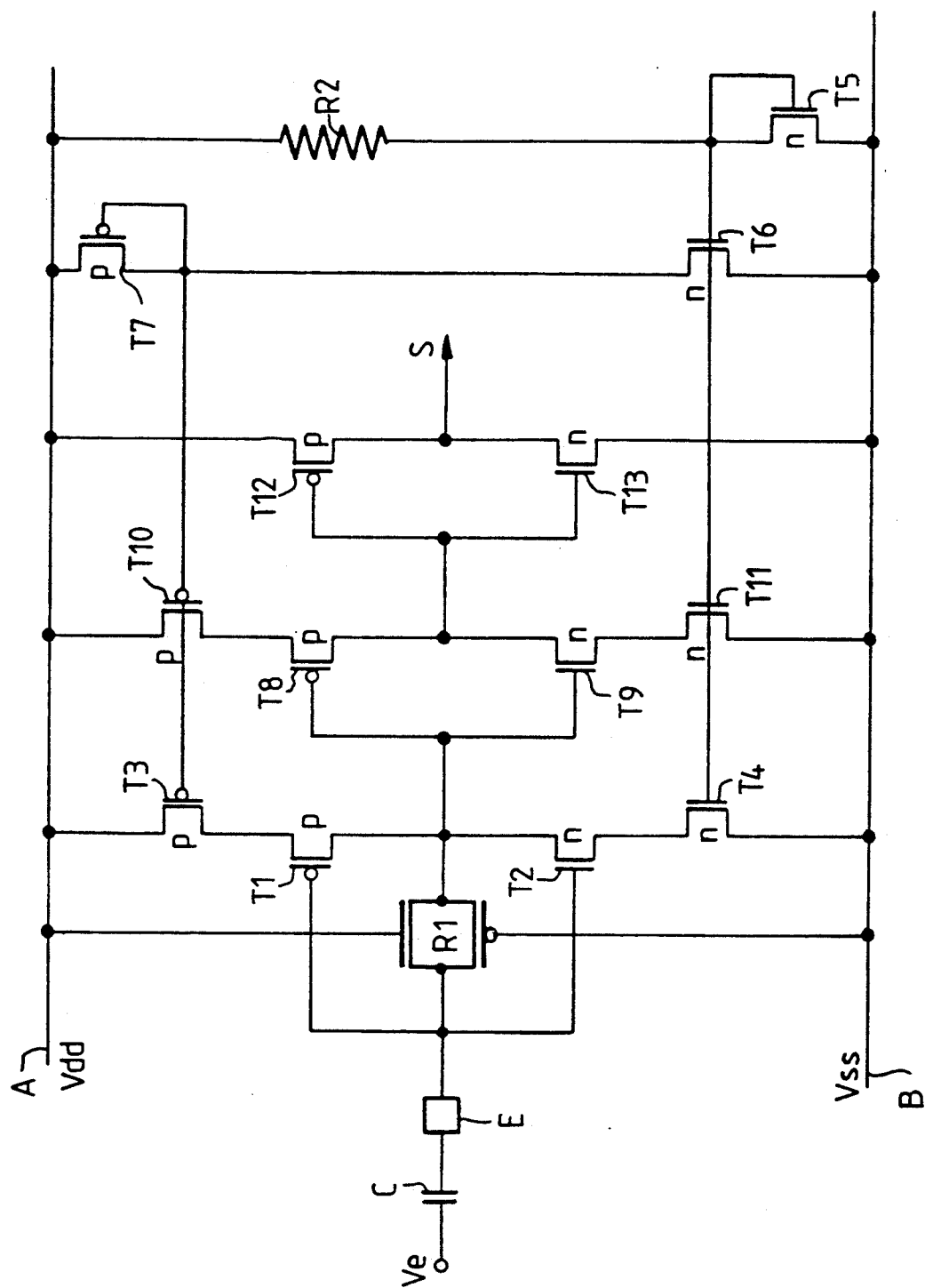

SINGLE-PIN AMPLIFIER IN INTEGRATED CIRCUIT FORM

This is a continuation of application Ser. No. 774,063, filed Oct. 9, 1991, now abandoned.

BACKGROUND OF THE INVENTION

1. Field of the Invention

The invention relates to integrated circuits incorporating amplifiers.

With the development of MOS and CMOS technologies, the present trend is towards the integration of increasingly complex systems that combine both logic and analog functions on one and the same integrated circuit chip.

The problems that arise then relate to interference between the logic part and the analog part, i.e. the noise-infestation of the analog functions by the logic signals that travel through neighbouring conductors.

The primary cause of this noise is the switching over of logic signals between two voltage levels that are relatively distant from one another. The transients thus generated are passed on capacitively or inductively to neighbouring conductors which they disturb. The noise thus generated covers a wide spectrum of frequencies since the logic level transitions may be very steep and the logic level steps may be flat.

The disturbed conductors include, for example, the supply (Vcc and Vss) lines. But there may be other circuit elements such as, for example, the substrate of the integrated circuit itself: when the potential of the substrate is transiently altered by noise, this influence is reflected in the active devices which have channels continuous with the substrate.

In particular, in analog functions (amplifiers for example), the logic noise generated by the neighbouring logic functions may give rise to an instability of the reference voltages internal to the circuit, whether it is the reference of the substrate or a supply voltage; or quite simply the point of operation at rest of a circuit node.

2. Description of the Prior Art

To compensate for these instabilities, it is often necessary to provide compensation means. For example, the most frequently used method consists in setting up (noise-free) reference current sources externally to the integrated circuit, to provide the noise-free references needed. In some cases, integrated circuit configurations are also used, with separate supplies provided for the analog part and for the logic part of the circuit, so that interference is minimized.

One of the problems encountered then is that there is an increase in the number of external pins of the integrated circuit. It is known that it is desirable to reduce the number of external pins of an integrated circuit to the greatest possible extent.

SUMMARY OF THE INVENTION

An aim of the invention is the making of an amplifier to amplify an analog signal coming from the exterior of an integrated circuit which:

uses only one pin of the circuit in addition to two supply pins (these two pins being, in any case, necessary for the rest of the circuit), works in a frequency band that is noise-infested by neighbouring logic signals;

has high sensitivity (minimum input level of low value) and low phase noise, and has a stable bias point when there is no input signal despite the noise present at the supplies (in other words, efficient rejection of the common mode with respect to the supplies, despite the fact that the amplifier is not a differential amplifier since it will have only one input pin).

This type of amplifier proves to be necessary in all the systems where the phase of the signal is important and where, however, the manufacturing cost should remain low (the cost of the pins in particular). This is the case, for example, with phase-locked loops.

According to the invention, there is therefore proposed an analog amplifier in integrated circuit form having an input connected to an input pin (E) of the integrated circuit, the analog amplifier being supplied by a first supply conductor (A) and a second supply conductor (B), both these supply conductors being common to a logic part and an analog part of the integrated circuit, said analog amplifier including at least one amplifier stage, wherein the problems of disturbance of the working of the analog amplifier by the noises that are generated by the logic part and transmitted by the common supply conductors are eliminated by the following assembly:

an amplifier stage constituted by an inverter constituted by a pair of complementary MOS transistors, with a first complementary MOS transistor (T1) and a second MOS transistor (T2) connected in series, their gates being connected together to an input of the amplifier stage, their drains being connected together to an output of the amplifier stage, the amplifier stage further comprising a third MOS transistor (T3) that is designed to impose a current entering the inverter and is series-connected between the first supply connector (A) and the source of the first MOS transistor (T1), and a fourth MOS transistor (T4) that is designed to impose a current leaving the inverter and is series-connected between the second supply conductor (B) and the source of the second MOS transistor (T2), a current reference stage comprising a first branch between the first supply conductor and the second supply conductor, with a resistor R2 in series with a fifth MOS transistor (T5) mounted as a diode;

and a second branch with a sixth MOS transistor (T6) and a seventh MOS transistor series-connected between the first supply conductor and the second supply conductor, the sixth transistor (T6) being mounted as a current mirror to impose a reference current in the transistor (T7) which is mounted as a diode;

the third MOS transistor (T3) and the fourth MOS transistor (T4) of the amplifier stage being respectively mounted as a current mirror with respect to the seventh MOS transistor (T7) and the fifth MOS transistor (T5) so that the incoming current imposed by the third MOS transistor (T3) is equal to the outgoing current imposed by the fourth MOS transistor (T4).

A negative feedback resistor is preferably provided between the connected gates and connected drains of the transistors of the complementary pair. This resistor is set up, for example, by means of two parallel-connected complementary transistors, each having its gate respectively connected to one of the supply conductors.

The amplifier may have two series-connected stages each comprising a complementary pair and the transistors used to supply them with current (third and fourth current). The negative feedback resistor, which is preferably on the first stage, is not necessarily provided for on the second stage. A third stage, with or without a negative feedback resistor, may also be provided for. This third stage does not necessarily have the third and fourth current supply transistors, because the levels of input voltage that it receives after amplification in the first two stage are sufficiently high.

BRIEF DESCRIPTION OF THE DRAWING

Other features and advantages of the invention shall appear from the following detailed description, which is made with reference to the appended drawing, in which the single figure represents a detailed example of the embodiment of the invention.

MORE DETAILED DESCRIPTION

The amplifier is supplied with power by two supply conductors A and B at voltages of Vdd and Vss respectively. For example, Vdd is about +5 volts, Vss being the zero potential reference.

A single input pin E is needed for the amplifier (there is no second pin to constitute a differential input, and no pins for the connection thereto of compensation circuits external to the integrated circuit).

The input signal to be amplified, Ve, will be applied to this input pin E in principle through a capacitor C external to the integrated circuit.

The amplifier shown has several stages, the most important one according to the invention being the first or input stage.

The first amplifier stage comprises a pair of complementary transistors T1 and T2 (p and n type respectively) in series between the conductors A and B. The transistors T1 and T2 are connected together by their drains. Their gates are connected together to the input pin E (in principle directly).

The source of transistors T1 is connected to the drain of a third transistor T3 of the same type (p), itself further connected to the conductor A. The third transistor T3 constitutes a transistor for the supply of current to the complementary pair T1, T2. The supply current is an incoming (pull-up) current. The source of transistor T2 is connected to the drain of a fourth transistor T4 of a same type (n) which is itself connected to the conductor B. The transistor T4 is also a transistor for the supply of current to the complementary pair, the current being an outgoing (pull-down) current this time.

As shall be seen, these transistors T3, T4 are controlled so that the currents that they impose in the complementary pair T1, T2 are identical, i.e. that the incoming current is equal to the outgoing current, this being the case independently of the fluctuations in the supply voltage which may be noise-infested by the neighbouring logic signals.

To limit the gain of the input amplifier stage thus constituted, a resistance R1 may be provided between the output of this first amplifier stage (taken at the drains of the transistors T1 and T2) and the input (taken at the connected gates of these transistors T1 and T2). This resistor R1 may be made out of two parallel-connected complementary transistors, the p channel transistor having its gate connected to Vss and the n channel transistor having its gate connected to Vdd.

For the control of the third and fourth transistors T3 and T4 there is provision for a current mirror circuit successively copying currents from a fifth transistor T5 mounted as a diode (its gate is connected to its drain).

The transistor T5 is series-connected with a resistor R2, the set being connected between the conductors A and B. The transistor T5 is biased in saturated mode. It is crossed by a current that is essentially related to its geometry, i.e. to its channel width/length ratio. It will serve as a reference current source.

If the transistor T5 is an n channel transistor (in the example), its source is connected to Vss. If it were a p channel transistor, its source would be connected to Vdd.

The current in the transistor T5 is copied by current mirror effect in a sixth transistor T6 of a same type, having its gate and its source connected respectively to the gate and source of T5.

The transistor T6 is series-connected with a seventh transistor T7 of an opposite type, mounted as a diode (with its gate connected to its drain). These two transistors T6, T7 are series-connected between the supply conductors A(Vdd) and B(Vss). The source of one is connected to Vss and the source of the other is connected to Vdd.

The transistors T5 and T7 act as references for the currents in the third and fourth transistors T3 and T4. Current mirror assemblies between these four transistors, taken two by two, are provided to this effect. Naturally, the transistors are associated by pairs of the same type so that the copying of the current is possible: if the third transistor T3 is of a p type, it must copy the current of a p type transistor. In the example of the figure, it is the transistor T7, but if transistor T5 were to be a p type transistor, it is the transistor T6 that would be of the p type and serve as a reference for the fourth transistor T4, transistor T7 being an n type transistor and serving as a reference for the transistor T3.

In the example of the figure, the transistor T3 is mounted as a current mirror to copy the current in transistor T7, i.e. transistor T3 has its source and its gate connected respectively to the source and gate of transistor T7.

In the same way, transistor T4 has its gate connected to the gates of transistors T6 and T5, and its sources connected to the sources transistors T6 and T5.

The copying ratios are chosen in such a way that the currents in transistors T3 and T4 are equal, one being an incoming current and the other being an outgoing current. It is known that the copying ratios are the geometrical ratios of the transistors. The geometry of a transistor is expressed by its channel width to length ratio. This means that the ratio between the geometries of transistors T5 and T4 should be the same as the ratio between the geometries of transistors T7 and T3.

When the supply voltage is noise-infested, these ratios are preserved and, consequently, the incoming current remains equal to the outgoing current even if its absolute value changes very slightly. The bias point of the amplifier stage therefore does not undergo a modulation corresponding to the noise present at the supply.

The amplifier according to the invention may include a second amplifier stage with another pair of complementary transistors T8, T9, similar to the pair T1, T2, supplied with current identically by a transistor T10 (incoming current) and a transistor T11 (outgoing current). The incoming current is made equal to the outgoing current in the same way as for the first amplifier stage, and it is not necessary to provide for other transistors to establish the current references: the transistors T5, T6 and T7 serve as references also for the second stage: the transistor T10, if it is of a p type, copies the current of the transistor of a same type (T7 in the example of the figure); to this end, its source and its gate are connected to the source and the gate respectively of transistor T7. The same is true of the transistor T11 which copies the current in T5.

The input of the second stage (connected gates of transistors T8 and T9) is connected to the output of the first stage (connected gates of transistors T1 and T2). The output is taken at the connected drains of transistors T8 and T9.

It is noted that, in the example of the figure, there is no provision for any negative feedback resistor between the output and input of the second stage.

The dimensions of the transistors of the second stage are designed so as to have a maximum gain at rest for this stage.

A third stage may be provided for, in order to obtain, at output, levels compatible with the standard CMOS levels. This final stage does not need to be supplied through two current generators like the first stage and, possibly, the second stage: the complementary pair T12, T13 that constitutes it is connected directly between the conductors A and B like a standard inverter stage.

The output S of the amplifier is taken at the output of the last stage.

It is also possible to envisage other arrangements with a greater number of stages, for example an additional stage between the second and third stages.

What is claimed is:

1. An analog amplifier in integrated circuit form having an input connected to an input pin of the integrated circuit, the analog amplifier being supplied by a first supply conductor and a second supply conductor, both these supply conductors being common to a logic part and an analog part of the integrated circuit, said analog amplifier including at least one amplifier stage, wherein disturbance of the working of the analog amplifier by the noise generated by the logic part and transmitted by the common supply conductors is eliminated by the following assembly:
   a first amplifier stage comprising first and second complementary MOS transistors connected in series, their gates being connected together to an input of the amplifier stage and their drains being connected together to an output of the amplifier stage; the amplifier stage further comprising a third MOS transistor which is series-connected between the first supply connector and the source of said first MOS transistor, and a fourth MOS transistor which is series-connected between the second supply conductor and the source of said second MOS transistor,
   a current reference stage comprising a first branch between the first supply conductor and the second supply conductor, with a resistor in series with a fifth MOS transistor connected as a diode;
   and a second branch with a sixth MOS transistor and a seventh MOS transistor series-connected between the first supply conductor and the second supply conductor, said seventh MOS transistor being connected as a diode and said sixth MOS transistor being mounted as a current mirror with respect to said fifth MOS transistor to impose a reference current in said seventh MOS transistor;
   said third MOS transistor and said fourth MOS transistor of said amplifier stage being respectively connected as a current mirror with respect to said seventh MOS transistor and to said fifth MOS transistor so that the incoming current passed by said third MOS transistor is equal to the outgoing current passed by said fourth MOS transistor.

2. An analog amplifier in integrated circuit form according to claim 1, wherein a negative feedback resistor R1 is placed between the input and the output of the amplifier stage.

3. An analog amplifier in integrated circuit form according to claim 2, comprising two amplifier stages in series, each comprising an amplifier together with an additional pair of complementary MOS transistors, one MOS transistor of said additional pair being connected to impose a current entering the amplifier and another MOS transistor of said additional pair being connected to impose a current leaving the amplifier.

4. An analog amplifier in integrated circuit form according to claim 3, wherein the current reference stage comprising the resistor R2 and the fifth, sixth and seventh MOS transistors is common to the two amplifier stages.

5. An analog amplifier in integrated circuit form according to claim 4, comprising an output stage with an inverter comprising a pair of complementary MOS transistors.

6. An analog amplifier in integrated circuit form according to claim 1, comprising two amplifier stages in series, each comprising an additional pair of complementary MOS transistors, one MOS transistor of said additional pair being connected to impose a current entering said respective amplifier stage and another MOS transistor of said additional pair being connected to impose a current leaving said respective amplifier stage.

7. An analog amplifier in integrated circuit form according to claim 6, wherein the current reference stage comprising the resistor R2 and the fifth, sixth and seventh MOS transistors is common to the two amplifier stages.

8. An analog amplifier in integrated circuit form according to claim 7, comprising an output stage with an inverter comprising a pair of complementary MOS transistors.

9. An integrated circuit having a logic part and an analog part and comprising an input pin, a first voltage supply conductor, a second voltage supply conductor, and an analog amplifier; said first and second voltage supply conductors being common to said logic part and said analog part; said analog amplifier comprising at least a first amplifier stage and a current reference stage; said input pin being the only input for said first amplifier stage and for said analog amplifier;
   said first amplifier stage comprising an inverter constituted by a first transistor and a second transistor connected in series, said first and second transistors being complementary MOS transistors, the gates of said first and second transistors being connected together and to said input pin, the drains of said first and second transistors being connected together and to an output of said first amplifier stage;
   said first amplifier stage further comprising a third transistor and a fourth transistor, said third transistor being series connected between said first voltage supply conductor and the source of said first transistor, said fourth transistor being series connected between said second voltage supply conductor and the source of said second transistor;

said current reference stage comprising a first branch and a second branch, said first branch comprising a resistor and a fifth transistor connected in series between said first and second voltage supply conductors, said second branch comprising a sixth transistor and a seventh transistor connected between said first and second voltage supply conductors, said sixth transistor being mounted as a current mirror with respect to said fifth transistor, said seventh transistor being mounted as a diode;

said third transistor being mounted as a current mirror with respect to said seventh transistor, and said fourth transistor being mounted as a current mirror with respect to said fifth transistor.

10. An integrated circuit in accordance with claim 9 wherein said analog amplifier further comprises a negative feedback resistor connected between the input of said first amplifier stage and the output of said first amplifier stage.

11. An integrated circuit in accordance with claim 10 wherein said analog amplifier further comprises a second amplifier stage having an input terminal and an output terminal, the input terminal of said second amplifier stage being connected to the output terminal of said first amplifier stage.

12. An integrated circuit in accordance with claim 11 wherein said second amplifier stage comprises an inverter constituted by an eighth transistor and a ninth transistor connected in series, said eighth and ninth transistors being complementary MOS transistors, the gates of said eighth and ninth transistors being connected together and to the input of the second amplifier stage, the drains of said eighth and ninth transistors being connected together and to the output of said second amplifier stage.

13. An integrated circuit in accordance with claim 12 wherein said second amplifier stage further comprises a tenth transistor and an eleventh transistor, said tenth transistor being series connected between said first voltage supply conductor and the source of said eighth transistor, said eleventh transistor being series connected between said second voltage supply conductor and the source of said ninth transistor.

14. An integrated circuit in accordance with claim 13 wherein said tenth transistor is mounted as a current mirror with respect to said seventh transistor, and said eleventh transistor is mounted as a current mirror with respect to said fifth transistor.

15. An integrated circuit in accordance with claim 14 wherein each of said first, second, third, fourth, fifth, sixth, seventh, eighth, ninth, tenth, and eleventh transistors is a MOS transistor.

16. An integrated circuit in accordance with claim 9 wherein said analog amplifier further comprises a second amplifier stage having an input terminal and an output terminal, the input terminal of said second amplifier stage being connected to the output terminal of said first amplifier stage.

17. An integrated circuit in accordance with claim 16 wherein said analog amplifier further comprises a third amplifier stage having an input terminal and an output terminal, the input terminal of said third amplifier stage being connected to the output terminal of said second amplifier stage.

18. An integrated circuit in accordance with claim 17 wherein said second amplifier stage comprises an inverter constituted by an eighth transistor and a ninth transistor connected in series, said eighth and ninth transistors being complementary MOS transistors, the gates of said eighth and ninth transistors being connected together and to the input of the second amplifier stage, the drains of said eighth and ninth transistors being connected together and to the output of said second amplifier stage.

19. An integrated circuit in accordance with claim 18 wherein said third amplifier stage comprises a tenth transistor and an eleventh transistor connected in series, said tenth and eleventh transistors being complementary MOS transistors, the gates of said tenth and eleventh transistors being connected together and to the input of the third amplifier stage, the drains of said tenth and eleventh transistors being connected together and to the output of said third amplifier stage.

20. An integrated circuit in accordance with claim 19 wherein said second amplifier stage further comprises a twelfth transistor and a thirteen transistor, said twelfth transistor being series connected between said first voltage supply conductor and the source of said eighth transistor, said thirteenth transistor being series connected between said voltage supply conductor and the source of said ninth transistor.

21. A CMOS integrated circuit, including both analog and digital circuit elements, and comprising:
 a positive and a negative power supply connection;
 a diode-connected N-channel field-effect transistor, connected, in series with a first current-limiting element, between said positive and negative power supply connections;
 a diode-connected P-channel field-effect transistor, connected, in series with a second current-limiting element, between said positive and negative power supply connections;
 a first amplifier stage, connected to receive a low-level input signal;
 a first current source transistor, connected to source current to said first amplifier stage, said current source transistor being a P-channel field effect transistor having a gate connected to the gate of said diode-connected P-channel field-effect transistor;
 a first current sink transistor, connected to sink current to said first amplifier stage, said current sink transistor being an N-channel field effect transistor having a gate connected to the gate of said diode-connected N-channel field-effect transistor;
 wherein said first current sink transistor and said first current source transistor have geometries related by the relation $$\frac{WL_P}{WL_N} = \frac{WL_{DP}}{WL_{DN}},$$

where $WL_P$ is the width-to-length ratio of said first current source transistor, $WL_N$ is the width-to-length ratio of said first current sink transistor, $WL_{DP}$ is the width-to-length ratio of said diode-connected P-channel transistor, and $WL_{DN}$ is the width-to-length ratio of said diode-connected N-channel transistor.

22. The integrated circuit of claim 21, further comprising a resistance connected between the input and the output of said first amplifier stage.

23. The integrated circuit of claim 21, wherein both said power supply connections provide power to all transistors on said integrated circuit, including both analog and digital circuits.

24. The integrated circuit of claim 21, wherein said first current-limiting element consists essentially of a resistor, and said second current-limiting element consists essentially of an additional P-channel field-effect transistor which has a gate connected to the gate of said diode-connected P-channel transistor.

25. The integrated circuit of claim 21, wherein said second current-limiting element consists essentially of a resistor, and said first current-limiting element consists essentially of an additional N-channel field-effect transistor which has a gate connected to the gate of said diode-connected N-channel transistor.

26. The integrated circuit of claim 21, wherein each said field-effect transistor is an insulated-gate field-effect transistor.

27. The integrated circuit of claim 21, wherein said first amplifier stage comprises exactly one P-channel field-effect transistor and exactly one N-channel field-effect transistor having gates connected together to said input, and having drains connected together to provide an output.

28. An integrated circuit, including both analog and digital circuit elements, comprising:
  a positive and a negative power supply connection;
  a diode-connected N-channel field-effect transistor, connected, in series with a first current-limiting element, between said positive and negative power supply connections;
  a diode-connected P-channel field-effect transistor, connected, in series with a second current-limiting element, between said positive and negative power supply connections;
  a first amplifier stage, connected to receive a low-level input signal, and comprising at least one P-channel field-effect transistor and at least one N-channel field-effect transistor having respective gates thereof connected together, and having respective drains thereof connected together to provide an output;
  a first current source transistor, connected to source current to said P-channel field-effect transistor of said first amplifier stage, said current source transistor being a P-channel field effect transistor having a gate connected to the gate of said diode-connected P-channel field-effect transistor;
  a first current sink transistor, connected to sink current to said N-channel field-effect transistor of said first amplifier stage, said current sink transistor being an N-channel field effect transistor having a gate connected to the gate of said diode-connected N-channel field-effect transistor;
  a second amplifier stage, connected to receive a low-level input signal, and comprising at least one P-channel field-effect transistor and at least one N-channel field-effect transistor having respective gates thereof connected to said output of said first amplifier stage, and having respective drains thereof connected together to provide an output.

29. The integrated circuit of claim 28, further comprising a resistance connected between the input and the output of said first amplifier stage.

30. The integrated circuit of claim 28, wherein both said power supply connections provide power to all transistors on said integrated circuit, including both analog and digital circuits.

31. The integrated circuit of claim 28, wherein said first current-limiting element consists essentially of a resistor, and said second current-limiting element consists essentially of an additional P-channel field-effect transistor which has a gate connected to the gate of said diode-connected P-channel transistor.

32. The integrated circuit of claim 28, wherein said second current-limiting element consists essentially of a resistor, and said first current-limiting element consists essentially of an additional N-channel field-effect transistor which has a gate connected to the gate of said diode-connected N-channel transistor.

33. The integrated circuit of claim 28, wherein each said field-effect transistor is an insulated-gate field-effect transistor.

34. The integrated circuit of claim 28, wherein said first current sink transistor and said first current source transistor have geometries related as $$\frac{WL_P}{WL_N} = \frac{WL_{DP}}{WL_{DN}},$$

where $WL_P$ is the width-to-length ratio of said first current source transistor, $WL_N$ is the width-to-length ratio of said first current sink transistor, $WL_{DP}$ is the width-to-length ratio of said diode-connected P-channel transistor, and $WL_{DN}$ is the width-to-length ratio of said diode-connected N-channel transistor.

35. An integrated circuit, which includes both analog and digital circuit elements, comprising:
  a positive and a negative power supply connection;
  a diode-connected N-channel insulated-gate field-effect transistor, connected, in series with a first current-limiting element, between said positive and negative power supply connections;
  a diode-connected P-channel insulated-gate field-effect transistor, connected, in series with a second current-limiting element between said positive and negative power supply connections;
  wherein said analog circuits include at least one group of first, second, and third amplifier stages, said first amplifier stage comprising a P-channel insulated-gate field-effect transistor and a N-channel insulated-gate field-effect transistor having respective gates thereof both operatively connected to an external input pin of said integrated circuit, and having respective drains thereof connected together to provide an output; said first amplifier stage further comprising a resistance element connected between said input and output thereof;
  a first current source transistor, connected to source current to said P-channel transistor of said first amplifier stage, said current source transistor being a P-channel insulated-gate field effect transistor having a gate connected to the gate of said diode-connected P-channel field-effect transistor;
  a first current sink transistor, connected to sink current to said N-channel field-effect transistor of said first amplifier stage, said current sink transistor being an N-channel insulated-gate field effect transistor having a gate connected to the gate of said diode-connected N-channel field-effect transistor;
  a second amplifier stage, comprising at least one P-channel insulated-gate field-effect transistor and at least one N-channel insulated-gate field-effect transistor having respective gates thereof connected together to said output of said first amplifier stage, and having respective drains thereof connected together to provide an output;

a second current source transistor, connected to source current to said P-channel field-effect transistor of said second amplifier stage, said current source transistor being a P-channel insulated-gate field effect transistor having a gate connected to the gate of said diode-connected P-channel field-effect transistor;

a second current sink transistor, connected to sink current to said N-channel field-effect transistor of said second amplifier stage, said current sink transistor being an N-channel insulated-gate field effect transistor having a gate connected to the gate of said diode-connected N-channel field-effect transistor;

a third amplifier stage, comprising at least one P-channel insulated-gate field-effect transistor and at least one N-channel insulated-gate field-effect transistor having respective gates thereof connected to said output of said second amplifier stage, and having respective drains thereof connected together to provide an output, and having respective sources thereof connected directly to said two power supply connections.

36. The integrated circuit of claim 35, wherein both said power supply connections provide power to all transistors on said integrated circuit, including both analog and digital circuits.

37. The integrated circuit of claim 35, wherein said first current sink transistor and said first current source transistor have geometries related as $$\frac{WL_{P1}}{WL_{N1}} = \frac{WL_{P2}}{WL_{N2}} = \frac{WL_{DP}}{WL_{DN}}.$$

where $WL_{P1}$ is the width-to-length ratio of said first current source transistor, $WL_{N1}$ is the width-to-length ratio of said first current sink transistor, $WL_{P2}$ is the width-to-length ratio of said second current source transistor, $WL_{N2}$ is the width-to-length ratio of said second current sink transistor, $WL_{DP}$ is the width-to-length ratio of said diode-connected P-channel transistor, and $WL_{DN}$ is the width-to-length ratio of said diode-connected N-channel transistor.

38. The integrated circuit of claim 35, wherein said first current-limiting element consists essentially of a resistor, and said second current-limiting element consists essentially of an additional P-channel field-effect transistor which has a gate connected to the gate of said diode-connected P-channel transistor.

39. The integrated circuit of claim 35, wherein said second current-limiting element consists essentially of a resistor, and said first current-limiting element consists essentially of an additional N-channel field-effect transistor which has a gate connected to the gate of said diode-connected N-channel transistor.

* * * * *